(12) United States Patent
Murakami

(10) Patent No.: US 7,385,212 B2
(45) Date of Patent: Jun. 10, 2008

(54) COLLECTOR OPTICAL SYSTEM, LIGHT SOURCE UNIT, ILLUMINATION OPTICAL APPARATUS, AND EXPOSURE APPARATUS

(75) Inventor: Katsuhiko Murakami, Tokyo (JP)

(73) Assignee: Nikon Corporation, Tokyo (JP)

( * ) Notice: Subject to any disclaimer, the term of this patent is extended or adjusted under 35 U.S.C. 154(b) by 349 days.

(21) Appl. No.: 11/327,339

(22) Filed: Jan. 9, 2006

(65) Prior Publication Data

US 2006/0120429 A1    Jun. 8, 2006

Related U.S. Application Data

(63) Continuation-in-part of application No. PCT/JP2004/010053, filed on Jul. 14, 2004.

(30) Foreign Application Priority Data

Jul. 14, 2003   (JP)  ............................ P2003-196194

(51) Int. Cl.
*H05G 2/00*   (2006.01)

(52) U.S. Cl. .............................. 250/504 R; 250/492.1; 250/492.2; 359/727

(58) Field of Classification Search ............ 250/504 R, 250/492.1, 492.2; 359/727
See application file for complete search history.

(56) References Cited

U.S. PATENT DOCUMENTS 4,525,853 A    6/1985 Keem et al.
6,285,743 B1    9/2001 Kondo et al.
6,312,144 B1 *  11/2001 Li ............................... 362/297
7,055,961 B2 *   6/2006 Huibers ........................ 353/84
7,217,940 B2 *   5/2007 Partlo et al. ............. 250/504 R
2002/0162975 A1  11/2002 Orsini

FOREIGN PATENT DOCUMENTS

| EP | 1 475 807 A2 | 11/2004 |
|---|---|---|
| JP | A-54-055177 | 5/1979 |
| JP | A-60-098399 | 6/1985 |
| JP | 05040223 A * | 2/1993 |
| JP | A-07-174896 | 7/1995 |
| JP | A 9-251097 | 9/1997 |
| JP | A 11-312638 | 11/1999 |
| JP | A 2000-68114 | 3/2000 |
| JP | A-2000-089000 | 3/2000 |
| JP | A-2002-311200 | 10/2002 |
| JP | A-05-040223 | 2/2003 |
| JP | A-2003-043296 | 2/2003 |
| WO | WO-A1-01-071249 | 9/2001 |

* cited by examiner

*Primary Examiner*—Jack I. Berman
*Assistant Examiner*—Michael Maskell
(74) *Attorney, Agent, or Firm*—Oliff & Berridge, PLC

(57) ABSTRACT

A light source unit of EUV light is provided as a light source unit comprising a plasma light source for emitting EUV light, a collective mirror which has a reflecting surface of an ellipsoid of revolution and at a first focal point of which the plasma light source is located, and an auxiliary collective mirror which has a reflecting surface of a spherical surface and a spherical center of which is located as displaced from a position of the plasma light source.

53 Claims, 9 Drawing Sheets

COLLECTOR OPTICAL SYSTEM, LIGHT SOURCE UNIT, ILLUMINATION OPTICAL APPARATUS, AND EXPOSURE APPARATUS

CROSS-REFERENCE TO RELATED APPLICATIONS

This is a continuation-in-part application of application serial no. PCT/JP2004/010053 filed on Jul. 14, 2004, now pending, and incorporated by reference in its entirety.

FIELD OF THE INVENTION

The present invention relates to a collector optical system, illumination optical apparatus, and exposure apparatus. More particularly, the present invention relates to a collector optical system suitably applicable to the exposure apparatus used in production of microdevices such as semiconductor elements by photolithography, using EUV light (Extreme UltraViolet light) having the wavelength of approximately 5-50 nm.

RELATED BACKGROUND ART

The exposure apparatus for production of semiconductor devices is arranged to project and transcribe a circuit pattern formed on a mask, onto a photosensitive substrate such as a wafer coated with a resist, through a projection optical system.

With the exposure apparatus of this type, there are desires for a further improvement in resolving power as the circuit pattern to be transcribed becomes finer and finer, and light of a shorter wavelength is being used as exposure light. In recent years, the exposure apparatus using the EUV (Extreme UltraViolet) light with the wavelength of approximately 5 to 50 nm (hereinafter referred to as "EUVL (Extreme UltraViolet Lithography) exposure apparatus") has been proposed as next-generation equipment.

At present, there are the following three types of light sources proposed heretofore, as light sources for supplying the EUV light:

(1) Light sources for supplying SR (synchrotron radiation);

(2) LPP (Laser Produced Plasma) light sources for obtaining the EUV light by focusing a laser beam on a target to turn the target into a plasma;

(3) DPP (Discharge Produced Plasma) light sources for obtaining the EUV light by applying a voltage on an electrode of a target substance, or between electrodes in a state in which a target substance is present between the electrodes, to turn the target material into a plasma.

The DPP light sources and LPP light sources will be generically referred to hereinafter as "plasma light sources."

The EUV light is isotropically radiated from a plasma light source. Namely, the plasma light source can be regarded as a point light source. The size (diameter) of the plasma light source is approximately from 50 to 500 μm.

FIG. 1 shows an example of a conventional collector optical system. A collective mirror 2 has a reflecting surface shaped in an ellipsoid of revolution, and, when the plasma light source 1 is positioned at the first focal point of the ellipsoid (hereinafter referred to as the first focal point), the EUV light reflected on the collective mirror 2 is collected at the second focal point of the ellipsoid (hereinafter referred to as the second focal point) to form a light source image 3 there. A stop 7 for blocking beams directly incident from the EUV light source 1 without being collected is located on a plane passing the second focal point of the collective mirror 2 and being perpendicular to the optical axis (hereinafter referred to as a second focal plane). An illumination optical system is located downstream of this stop 7.

In the above-described collector optical system as shown in FIG. 1, most of beams traveling from plasma light source 1 to the downstream area (to the right in FIG. 1) are not collected by the collective mirror 2 to be wasted. A conceivable means for collecting such beams traveling to the downstream area as well is the collector optical system as shown in FIG. 2.

Part of the EUV light diverging isotropically is also collected by collective mirror 2 having a reflecting surface shaped in an ellipsoid of revolution similar to the conventional collective mirror shown in FIG. 1, to form a light source image 3 on the second focal plane. On the other hand, other part of the EUV light is reflected by an auxiliary collective mirror 4 having a reflecting surface of spherical shape centered on the position of plasma light source 1, to be once collected at the same position as the plasma light source 1 is located. Thereafter, the light is reflected by the collective mirror 2 to be focused at the same position as the light source image 3 is formed.

Namely, a real image of the plasma light source 1 by the collective mirror 2 and a real image by an optical system as a combination of auxiliary collective mirror 4 with collective mirror 2 are formed as superimposed at the position of light source image 3.

Since this collector optical system is able to guide the beams diverging from the plasma light source 1, over a wider range of solid angles to the light source image 3, the quantity of light guided to the illumination optical system increases. The collector optical systems based on this idea are already put in practical use as collector optical systems of projectors or the like (e.g., production information of Panasonic DLP projector Lightia TH-D9610J [browsed May 26, 2003], Internet <http://panasonic.biz/projector/lightia/d9610/kido.html>).

The plasma used as an EUV light source strongly absorbs the EUV light in general. The reason why the EUV light of a specific wavelength is generated from the plasma is that an electron transits between energy levels inherent to an atom. Light is generated upon a transition to a lower energy level, whereas light of the same wavelength is absorbed upon a transition to a higher energy level. Therefore, light generated from a plasma is essentially largely absorbed by the plasma.

Therefore, the collector optical system of FIG. 2 cannot be applied directly to the EUV exposure apparatus.

The reason is that in the collector optical system of FIG. 2 the EUV light reflected by auxiliary collective mirror 4 and returning to the position of EUV light source 1 is absorbed by the plasma and thus cannot reach the position of the light source image 3 in fact. Accordingly, there is no increase in the total quantity of the collected EUV light.

SUMMARY OF THE INVENTION

The present invention has been accomplished in light of the above problem and an object of the invention is to construct a collector optical system so that the plasma does not absorb the EUV light reflected by the auxiliary collective mirror, thereby increasing the sum of collected EUV light, and to apply this collector optical system to an EUV exposure apparatus, thereby achieving a large increase of throughput.

In order to solve the above problem, the present invention adopts the following means.

A collector optical system according to the present invention is a light source unit of EUV light comprising: a plasma light source for emitting EUV light; a collective mirror which has a reflecting surface of an ellipsoid of revolution and at a first focal point (a focal point of the ellipsoid) of which the plasma light source is located; and an auxiliary collective mirror which has a reflecting surface of a spherical surface and a center of the spherical surface of which is located as displaced from a position of the plasma light source.

Since in the light source unit the center of the spherical surface of the auxiliary collective mirror is displaced from the position of the plasma light source, an image of the plasma light source by the auxiliary collective mirror is not formed at the position of the plasma light source. Therefore, this configuration can prevent the plasma from absorbing the EUV light reflected by the auxiliary collective mirror.

Furthermore, in the above collector optical system, preferably, the center of the spherical surface of the auxiliary collective mirror is positioned in a plane passing the first focal point of the collective mirror and being perpendicular to the optical axis (agreeing with an axis of the ellipsoid) (the plane will be referred to as a first focal plane of the ellipsoidal mirror) and is displaced by a distance equal to or larger than a radius of the plasma light source from the optical axis.

Since in the above collector optical system the center of the spherical surface of the auxiliary collective mirror is displaced by the distance equal to or larger than the radius of the plasma light source, the image of the plasma light source by the auxiliary collective mirror is positioned as displaced by the distance equal to or larger than the radius and is not formed at the position of the plasma light source. Therefore, It can more securely prevent the plasma from absorbing the EUV light reflected by the auxiliary collective mirror.

In the light source unit, preferably, the auxiliary collective mirror is comprised of a plurality of mirror elements having respective positions of spherical centers different from each other.

In the above light source unit, the auxiliary collective mirror is comprised of the plurality of mirror elements having the respective positions of spherical centers different from each other and this configuration increases the number of light source images formed on an entrance plane of an optical integrator described hereinafter, which improves illuminance uniformity on a mask surface after passage through an illumination optical system.

Another preferred configuration of the collector optical system is a collector optical system comprising a collective mirror having a reflecting surface of an ellipsoid of revolution; and an auxiliary collective mirror comprised of a spherical surface having a spherical center at a first focal point of the collective mirror, which satisfies $R > (t \times c)/2$, where R is a radius of the auxiliary collective mirror, t a duration of pulsed light from a plasma light source, and c the speed of light.

In the collector optical system, when the plasma light source is placed at the position of the first focal point, a round-trip distance between the plasma light source and the auxiliary collective mirror becomes longer than a distance $(t \times c)$ which is a product of the duration (t) of the pulsed light from the plasma light source and the speed of light (c). Therefore, when the EUV light reflected by the auxiliary collective mirror 2 comes back to the position of the plasma light source, the plasma is already extinct, so that the EUV light is not absorbed by the plasma.

In the foregoing light source unit, it is also preferable to place the plasma light source for emitting the EUV light, at the first focal point of the collector optical system.

In the above light source unit, the round-trip distance between the light source and the auxiliary collective mirror is longer than the distance $(t \times c)$ being the product of the duration (t) of pulsed light from the plasma light source and the speed of light (c). Therefore, when the EUV light reflected by the auxiliary collective mirror 2 comes back to the position of the plasma light source, the plasma is already extinct, so that the EUV light is not absorbed by the plasma. In addition, the EUV light can be collected while well suppressing loss of light quantity.

In the above light source unit, preferably, the collective mirror is divided into a partial mirror located near and a partial mirror located away from the plasma light source and only the partial mirror located near the plasma light source is arranged to be replaceable.

In the above light source unit, the reflecting surface is affected by radiant heat from the plasma light source and by heat from irradiation of the EUV light, and thus only the partial mirror heavily damaged thereby can be removed and readily replaced.

An illumination optical apparatus according to the present invention comprises the light source unit as described above, and an illumination optical system for guiding the EUV light from the light source unit to a mask.

The illumination optical apparatus is able to supply the EUV light from the light source unit without substantial loss of light quantity and to illuminate the mask with a predetermined pattern formed thereon, under a good illumination condition through the use of an optical integrator.

An exposure apparatus according to the present invention is an exposure apparatus comprising an illumination optical apparatus for illuminating a reflective mask on which a predetermined pattern is formed; a mask stage for holding the mask placed on a surface to be illuminated by the illumination optical apparatus; a wafer stage for holding a wafer; a projection optical system for projecting the predetermined pattern formed on the mask, at a predetermined demagnification ratio onto the wafer; and a driving unit for relatively moving the mask stage and the wafer stage relative to the projection optical system at a speed according to the demagnification ratio in synchronism on the occasion of projecting the predetermined pattern formed on the mask, onto the wafer, wherein the illumination optical apparatus is the one as defined above.

According to the present invention, as described above, the position of the spherical center of the auxiliary collective mirror is a little displaced from the position of the plasma light source, whereby the EUV light reflected by the auxiliary collective mirror is not absorbed by the plasma. This enables much more EUV light than before to be efficiently collected. By applying the light source unit with drastically increased efficiency of collection of light as described above, to the exposure apparatus, it becomes feasible to achieve a significant increase of throughput.

In the present invention, the round-trip distance between the plasma light source and the auxiliary collective mirror is set longer than the distance being the product of the duration of pulsed light from the plasma light source and the speed of light, whereby the plasma becomes extinct before the EUV light from the plasma light source comes back after reflected by the auxiliary collective mirror. Therefore, the EUV light reflected by the auxiliary collective mirror is not absorbed by the plasma. This enables much more EUV light than before to be efficiently collected. When the light source unit with drastically increased efficiency of collection of light is applied to the exposure apparatus, it becomes feasible to achieve a significant increase of throughput.

The present invention will be more fully understood from the detailed description given hereinbelow and the accompanying drawings, which are given by way of illustration only and are not to be considered as limiting the embodiment.

Further scope of applicability of the embodiment will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DETAILED DESCRIPTION OF THE PREFERRED EMBODIMENTS

Embodiment 1

Embodiments of the present invention will be described on the basis of the accompanying drawings.

Figure 3:
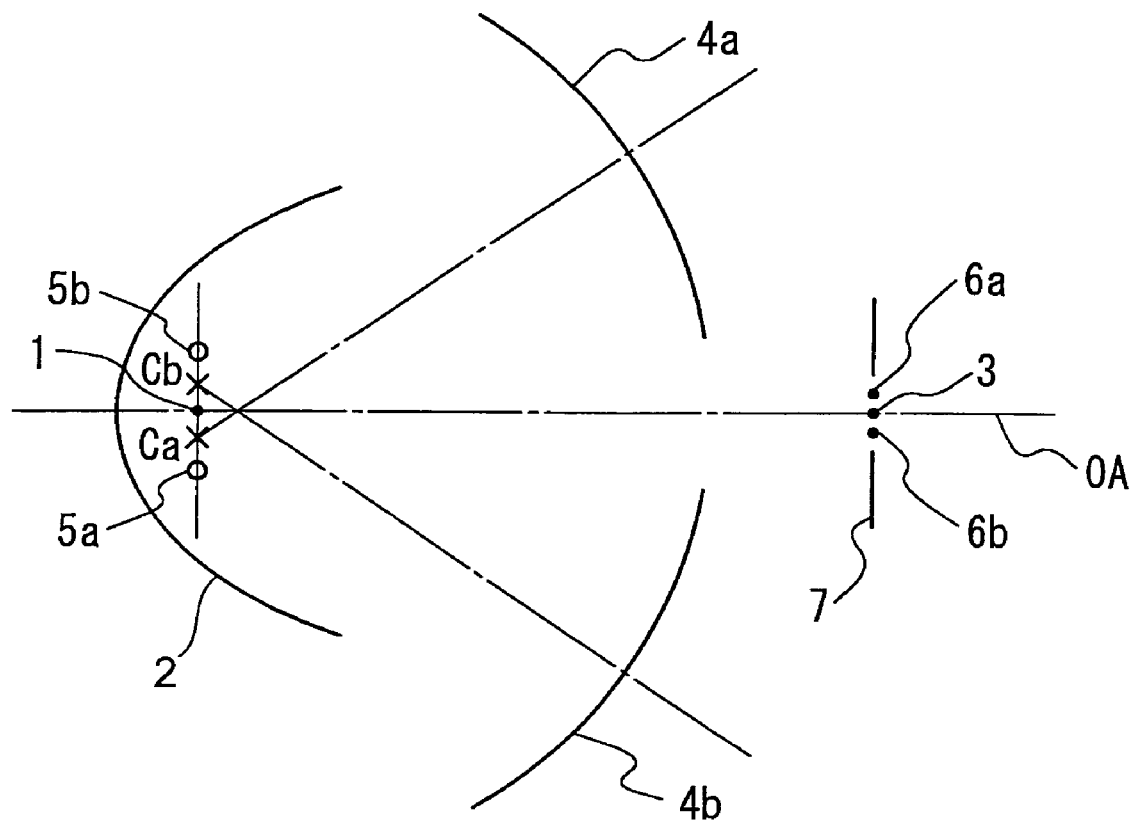
FIG. 3 is an illustration showing a collector optical system being an embodiment of the present invention.

FIG. 3 shows a light source unit being an embodiment of the present invention.

A plasma light source 1 is located at the first focal point of collective mirror 2 having a reflecting surface shaped in an ellipsoid of revolution (i.e., at a focal point of the ellipsoid). Auxiliary collective mirror elements 4a, 4b are arranged as inclined so that respective spherical centers Ca, Cb thereof are displaced by ±0.25 mm, respectively, in the direction perpendicular to the optical axis OA from the position of the plasma light source 1. Part of the EUV light emitted from the plasma light source 1 is reflected by the collective mirror 2 to form a light source image 3 on the second focal plane of the ellipsoid.

Other part of the EUV light emitted from the plasma light source 1 is reflected by the auxiliary collective mirror elements 4a, 4b to form light source images 5a, 5b at respective positions displaced by ±0.50 mm in the direction perpendicular to the optical axis OA, from the plasma light source 1. The size (diameter) of the plasma light source 1 is about 500 µm and therefore the light source images 5a, 5b do not overlap with the plasma position, so as to be able to avoid absorption by the plasma.

The light source images 5a, 5b are reflected by the collective mirror 2 to form light source images 6a, 6b on the second focal plane of the ellipsoid. A stop 7 for removing stray light is located on the second focal plane of the ellipsoid, and the light source images 3, 6a, 6b are formed as juxtaposed on an aperture provided in this stop 7. An illumination optical system (described later) is provided downstream the stop 7 and beams diverging from the light source images 3, 6a, 6b are guided thereto. The stop 7 can also serve as a vacuum bulkhead for differential pumping between the light source unit and the part where the illumination optical system and others are located.

In general, the illumination optical system in the exposure apparatus is constructed using an optical integrator for dividing a beam diverging from a light source to form a plurality of light source images, for implementing Köhler illumination. The use of the optical integrator can uniform an intensity distribution of illumination light projected onto a mask.

Since the collector optical system of the light source unit according to the present invention is arranged to form a plurality of light source images 3, 6a, 6b, it can be used as a part of functionality of the optical integrator.

Figure 4A:
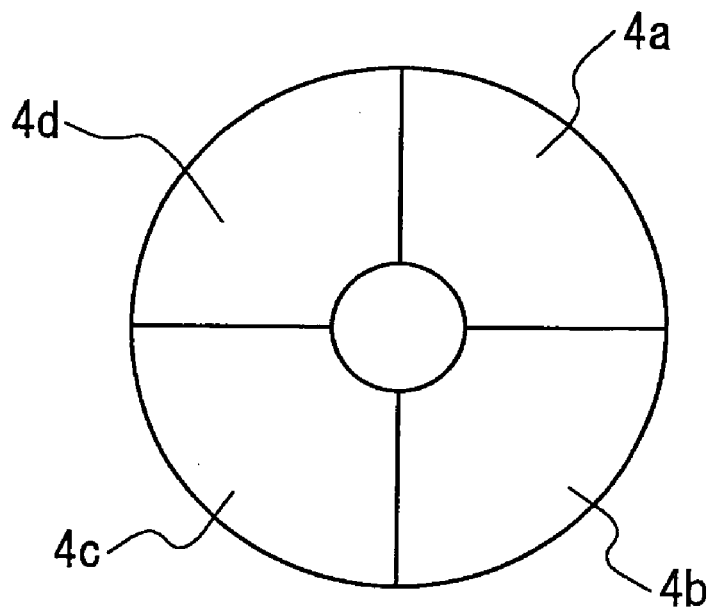
FIGS. 4A and 4B are illustrations respectively showing examples of an auxiliary collective mirror.
Figure 4B:
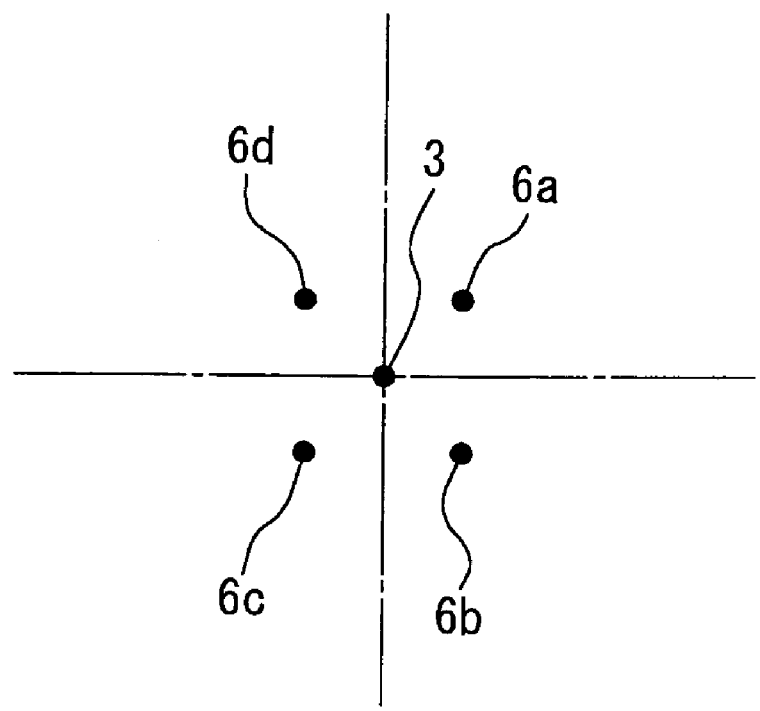

FIG. 3 provides a side view, and, when the collector optical system is viewed from the direction of the optical axis OA, the auxiliary collective mirror is divided into four elements 4a-4d in fact, as shown in FIG. 4A, and thus five light source images 3, 6a-6d are formed on the focal plane, as shown in FIG. 4B. Since the number of light source images formed on the entrance plane of the optical integrator is increased, the illuminance uniformity is improved on the exit plane of the optical integrator.

Figure 5A:
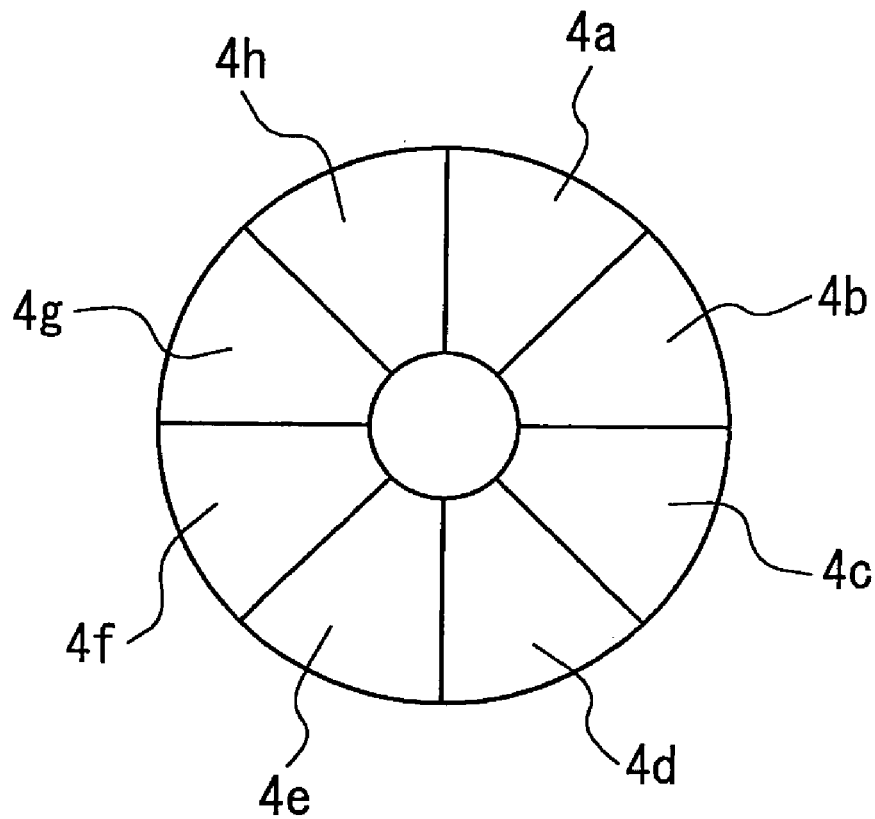
FIGS. 5A and 5B are illustrations respectively showing examples of an auxiliary collective mirror.
Figure 5B:
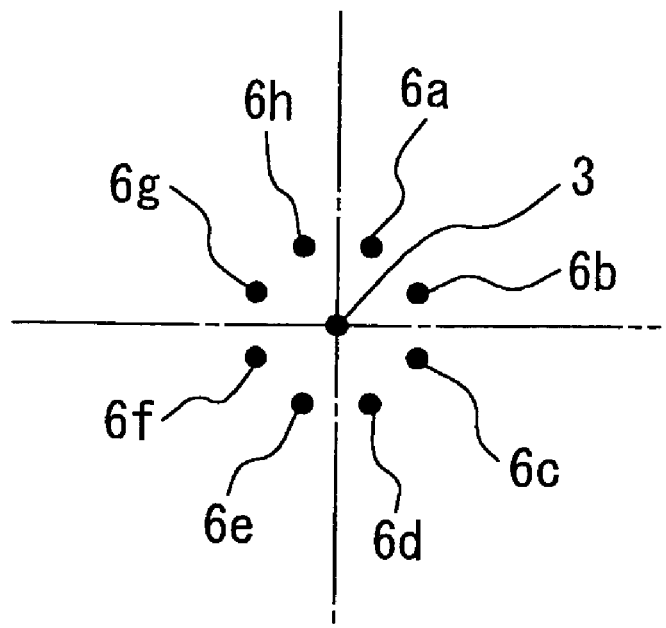

The auxiliary collective mirror may be divided into eight elements 4a-4h, as shown in FIG. 5A. In this case, nine light source images 3, 6a-6h are formed on the focal plane, as shown in FIG. 5B. It is noted that how to divide the auxiliary collective mirror is not limited to the above examples.

Figure 1:
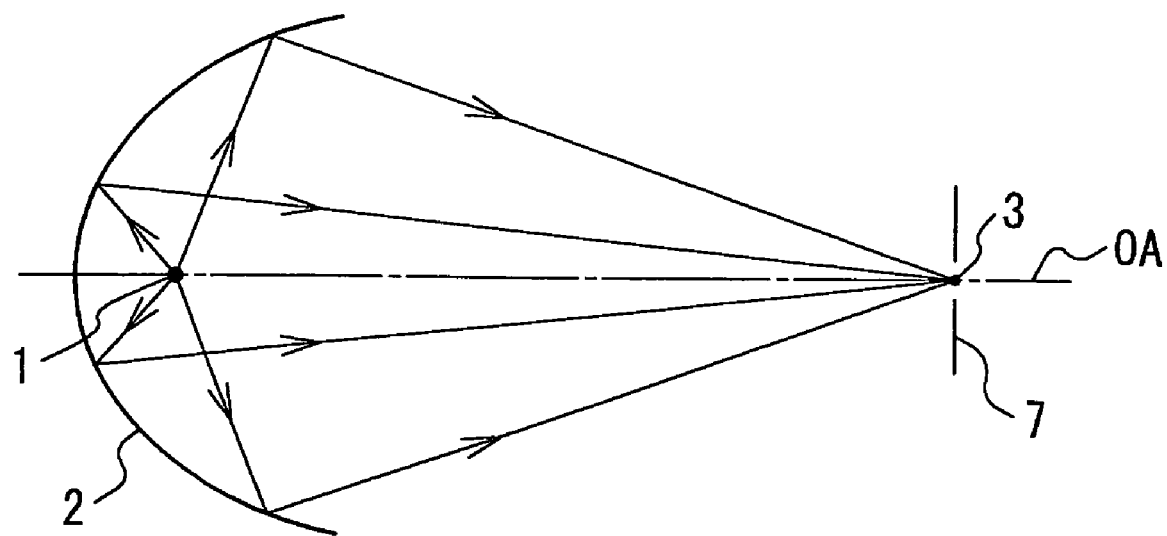
FIG. 1 is an illustration showing a conventional collector optical system.
Figure 6:
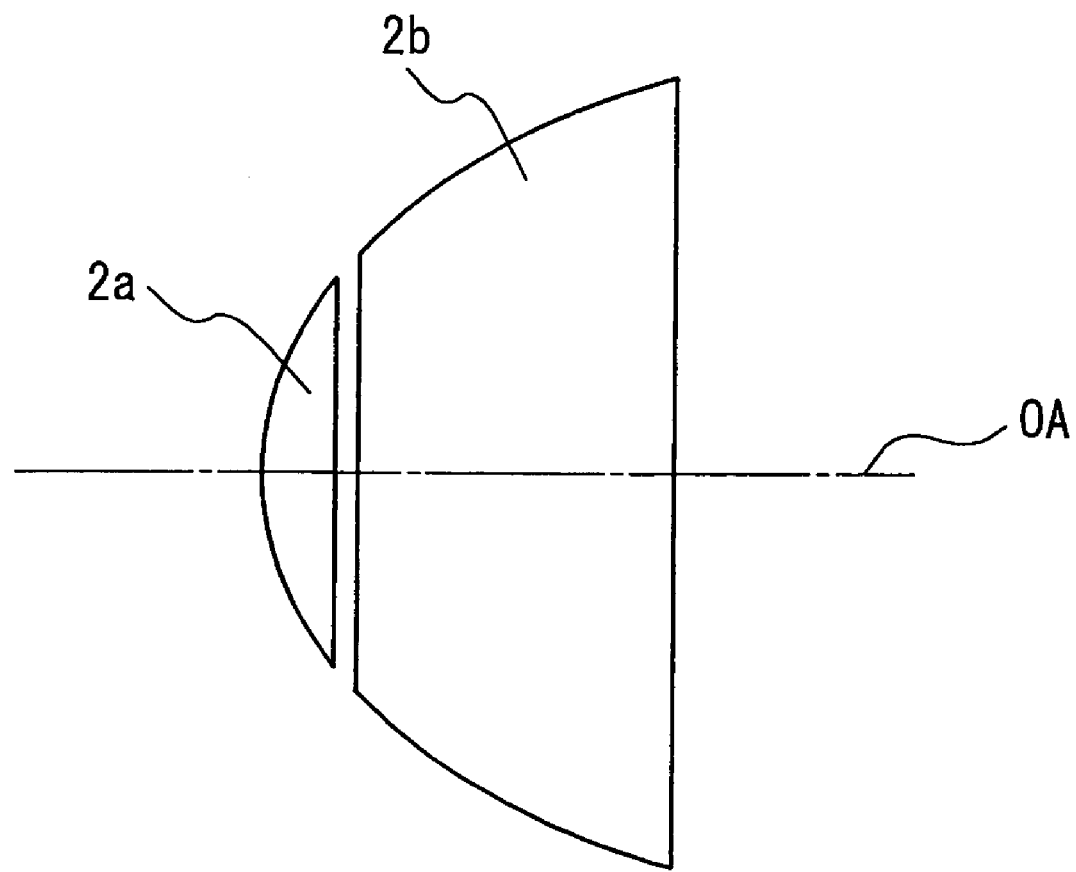
FIG. 6 is an illustration showing a modification example of a collective mirror according to the present invention.

FIG. 6 is a side view of a modification example of collective mirror 2 shown in FIG. 1. As shown in FIG. 6, the collective mirror can also be divided into two elements, a partial mirror 2a located near the plasma and a partial mirror 2b located away from the plasma. Particularly, the reflecting surface is affected by radiant heat from the plasma light source 1 and by heat from irradiation of EUV light and it is thus anticipated that there arises a need for removing and replacing only the partial mirror 2a heavily damaged. Therefore, it is desirable to adopt such a readily replaceable configuration.

Embodiment 3

Figure 7:
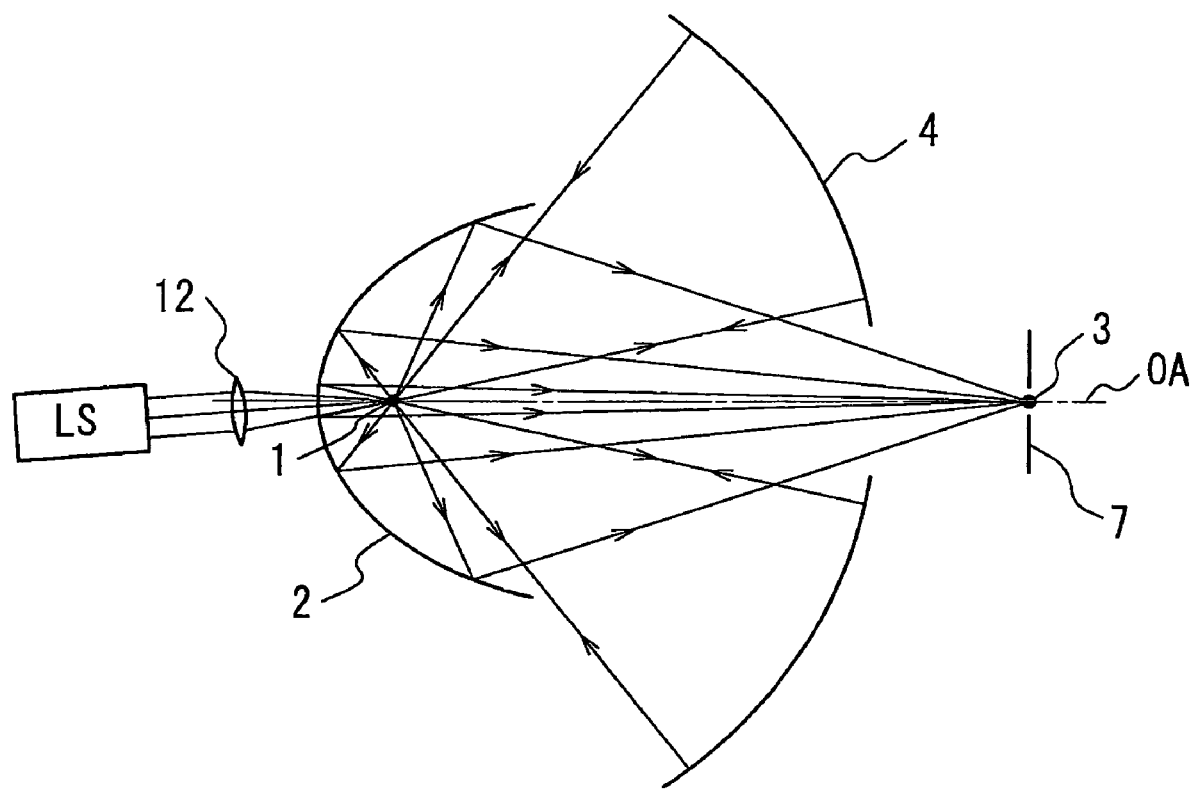
FIG. 7 is an illustration showing a collector optical system using an auxiliary collective mirror according to the present invention.

FIG. 7 shows a light source unit being an embodiment of the present invention. Referring to FIG. 7, the plasma light source 1 is arranged to collect light emitted from a laser light source LS (non-EUV light), through a lens 12 and a throughhole of collective mirror 2. The plasma light source 1 is located at the first focal point of collective mirror 2 having a reflecting surface shaped in an ellipsoid of revolution. There is an auxiliary collective mirror 4 having a reflecting surface of a spherical shape centered on the position of the first focal point. Part of the EUV light emitted from the plasma light source 1 is reflected by the collective mirror 2 to form a light source image 3 on the second focal plane of the ellipsoid. Other part of the EUV light emitted from the plasma light source 1 is reflected by the auxiliary collective mirror 4 to form a light source image 3 at the same position as the plasma light source 1 is located. The distance from the plasma light source 1 to the auxiliary collective mirror 2 is 40 cm. The plasma light source used herein is a laser produced plasma light source (LPP) and the duration of pulsed light from the plasma light source is 2 ns. The EUV light emitted from the plasma light source 1 travels through the distance of 80 cm before it comes back to the position of the plasma light source 1 after reflected by the auxiliary collective mirror 4, and it thus takes the time of 2.7 ns. Since the duration of pulsed light from the plasma light source is 2 ns, the plasma is already extinct when even the light generated in the initial part of a pulse comes back to the position of the plasma light source 1 after reflected by the auxiliary collective mirror 2. Therefore, the EUV light is not absorbed by the plasma. Beams traveling from this light source image are reflected by the collective mirror 2 to form a light source image 3 on the second focal plane of the ellipsoid. Namely, a real image of the plasma light source 1 by the collective mirror 2 and a real image by the optical system as a combination of the auxiliary collective mirror 4 with the collective mirror 2 are formed at the same position of the light source image 3 but at different times. A stop 7 for removing stray light is provided on the focal plane of the ellipsoid and the light source image 3 is formed on an aperture provided in this stop 7. An illumination optical system (not shown) is provided downstream the stop and beams diverging from the light source image 3 are guided thereto. The stop 7 can also serve as a vacuum bulkhead for differential pumping between the light source part and the part where the illumination optical system and others are located.

Embodiment 4

Figure 8:
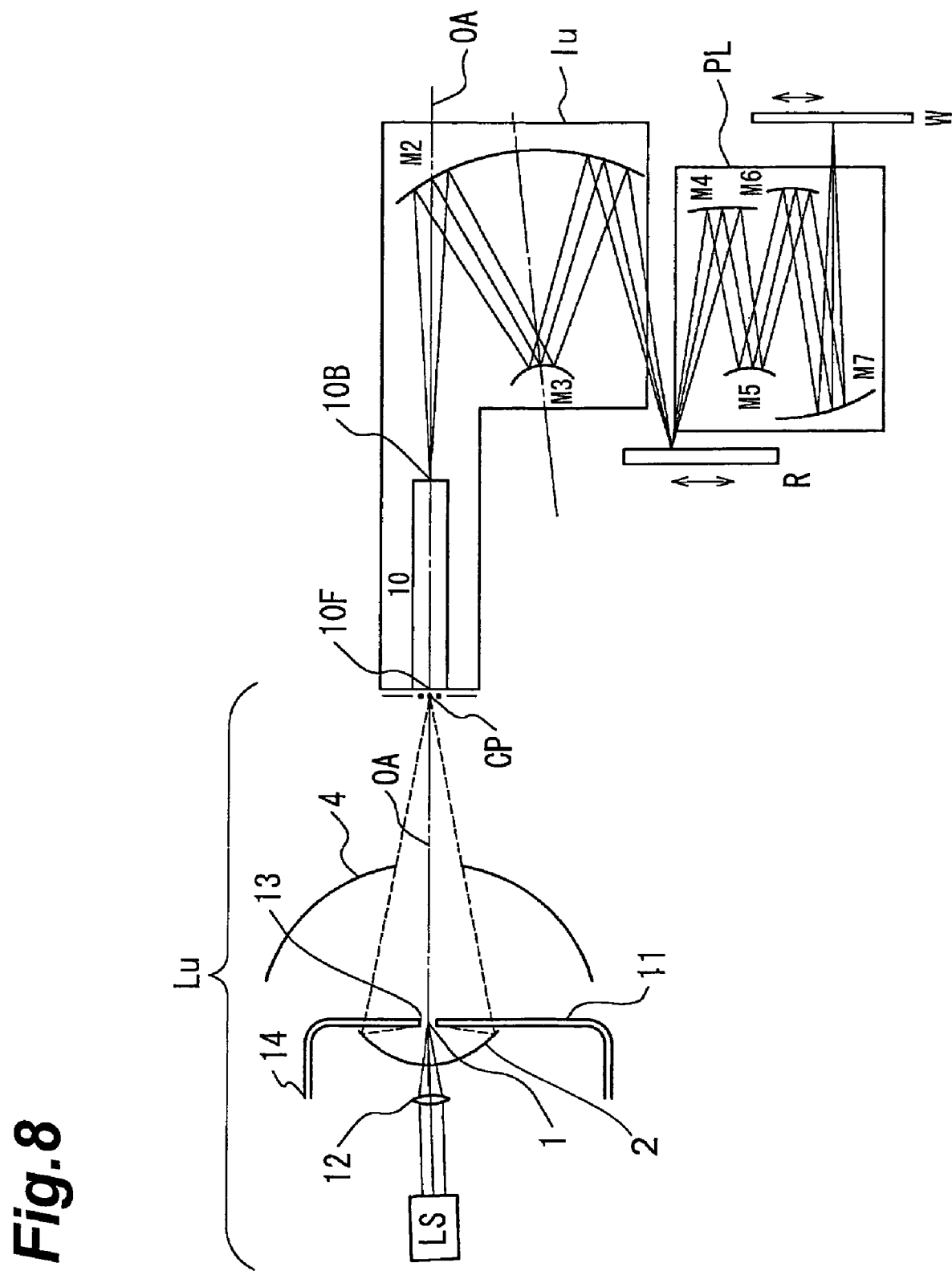
FIG. 8 is an illustration showing an example of an EUV exposure apparatus using a collector optical system according to the present invention.

FIG. 8 shows an embodiment of an EUV exposure apparatus incorporating an illumination optical system using the light source unit being the first embodiment of the present invention, and a rod type optical integrator proposed by Applicant of the present application et al. (Japanese Patent Application No. 2000-068114).

FIG. 8 is an illustration showing a schematic configuration of a first projection exposure apparatus according to the present embodiment, and the projection exposure apparatus is roughly composed of a light source unit LU, an illumination optical system IU, and a projection optical system PL. These are located in a vacuum state in a chamber, or in a chamber filled with a gas (e.g., helium) demonstrating little absorption to at least a wavelength to be used.

With reference to FIG. 8, the plasma light source 1 is arranged so that light emitted from a laser light source LS (non-EUV light) is collected through a lens 12 and a through-hole of collective mirror 2 onto a gas target 13.

The laser light source LS is desirably arranged as a little inclined relative to the optical axis OA so as to prevent the laser light (non-EUV light) from directly entering the illumination optical system IU downstream the second focal point CP of the collective mirror 2. Here the gas target 13 is formed from a gas ejected from a gas nozzle 14, e.g., a high-pressure gas of xenon (Xe). The gas target 13 turns into a plasma by energy from the collected laser light to emit EUV light. The gas target 13 is positioned at the first focal point of collective mirror 2. Therefore, the EUV light emitted from the plasma light source 1 is collected at the second focal point CP of the collective mirror 2. On the other hand, the gas after completion of light emission is drawn through a collector 11 to be guided to the outside. The auxiliary collective mirror 4 is comprised of two mirror elements and the two mirror elements are arranged as inclined so that their respective spherical centers are displaced by ±0.25 mm, respectively, in the direction perpendicular to the optical axis OA from the position of the plasma light source 1.

The illumination optical system IU is composed of an optical integrator 10 and an imaging system composed of a concave mirror M2 and a convex mirror M3. The optical integrator 10 is arranged so that its entrance end face 10F is located near the second focal point CP of the collective mirror 2, and light reflected on the internal wall surface of the optical integrator 10 and passing therethrough is emitted from an exit end face 10B.

Figure 2:
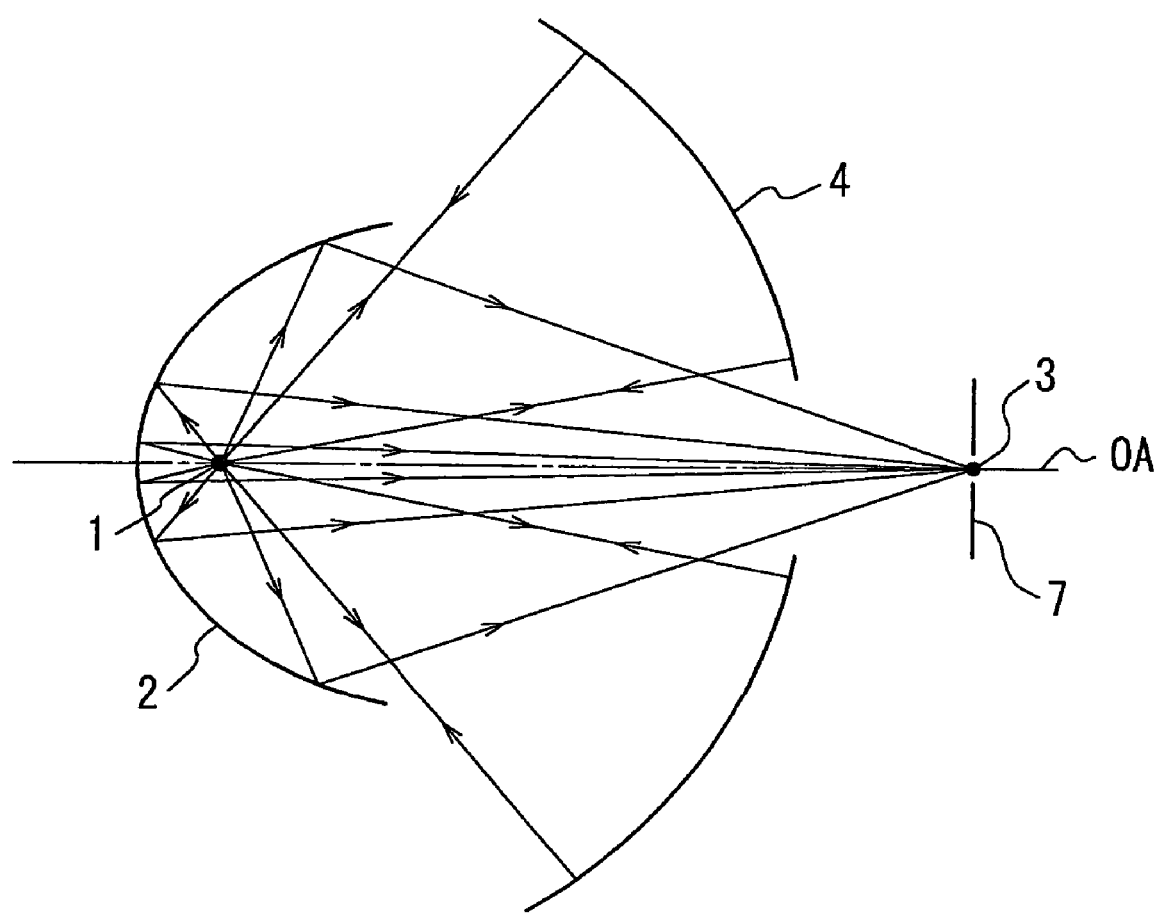
FIG. 2 is an illustration showing a collector optical system using a conventional auxiliary collective mirror.

The light emerging from the exit end face 10B of the optical integrator 10 is reflected by the concave mirror M2, reflected by the convex mirror M3, and further reflected by the concave mirror M2 to illuminate a reflective mask R. A device pattern surface of the mask R is arranged in the conjugate relation with the exit end face 10B of the optical integrator 10. As described with FIG. 2, the exit end face 10B is illuminated with good uniformity in plane, and thus the surface of the mask R is also uniformly illuminated.

The projection optical system PL is comprised of a concave mirror M4, a convex mirror M5, a concave mirror M6, and a concave mirror M7 arranged in the order named from the mask R side. The concave mirror M4, concave mirror M6, and concave mirror M7 are formed in an aspherical shape. This configuration is disclosed, for example, in Japanese Patent Application Laid-Open No. 9-251097.

The light reflected by the reflective mask R travels via the projection optical system PL to form a device pattern on a wafer W coated with a resist. Since an illuminated area on the mask R is smaller than the area of the device pattern of the mask, the mask R and the wafer W are scanned in synchronism, as indicated by arrows in FIG. 8, to effect exposure of the entire device pattern. After completion of the exposure of the entire device pattern, the wafer is stepped to a next exposure area. By repeating this operation, i.e., by the step-and-scan method, a plurality of device patterns are formed on the entire wafer.

Figure 9:
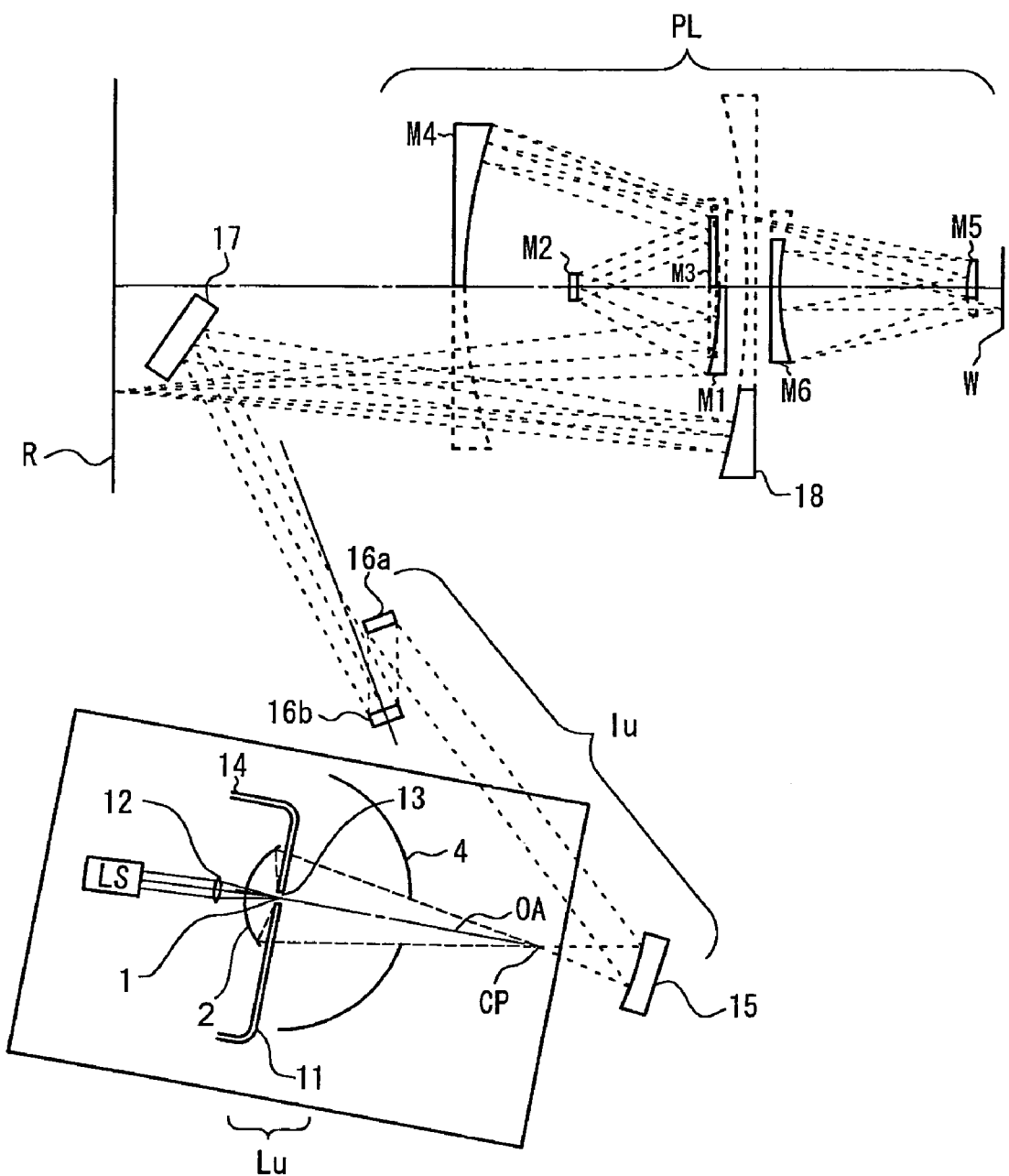
FIG. 9 is an illustration showing an example of an EUV exposure apparatus using a collector optical system according to the present invention.

The present embodiment described the example using the rod type optical integrator, but it is also possible to use a reflection type optical integrator, as described in Japanese Patent Application Laid-Open No. (JP-A) 11-312638. An example of an EUV exposure apparatus using a reflective optical integrator will be described with reference to FIG. 9.

The light source unit in the present embodiment has the same configuration as the light source unit of Embodiment 3 shown in FIG. 8, and thus description of redundant part is omitted herein. The EUV light collected at the second focal point CP of the collective mirror 2 is guided via a collimator mirror 15 to an integrator 16 consisting of a pair of fly's eye mirrors 16a and 16b. An example of the pair of fly's eye mirrors 16a and 16b is the fly's eye mirrors disclosed, for example, in JP-A 11-312638 by Applicant of the present application. Concerning the further detailed configuration and action of the fly's eye mirrors, reference can be made, for example, to the related description in JP-A 11-312638.

In this manner, a substantial surface illuminant having a predetermined shape is formed near the reflecting surface of the second fly's eye mirror 16b, i.e., near the exit plane of optical integrator 16. Light from the substantial surface illuminant is deflected by a plane mirror 17 and thereafter travels via a field stop (not shown) to form an illumination area of an arcuate shape elongated on the mask R. Light from the pattern on the mask R thus illuminated travels via the projection optical system PL to form an image of the mask pattern on the wafer W.

The projection optical system PL is composed of six mirrors arranged in order from the mask R side. For example, this configuration is disclosed in JP-A 11-312638.

In the above-described embodiment, the plasma light source 1 as a collector optical system is arranged at the first focal point of the collective mirror 2 having the reflecting surface of the shape of the ellipsoid of revolution (i.e., at the focal point of the ellipsoid) and the auxiliary collective mirror elements 4a, 4b are arranged as inclined so that their respective spherical centers are displaced by ±0.25 mm, respectively, in the direction perpendicular to the optical axis OA from the position of the plasma light source 1.

Without having to be limited to this, however, the collector optical system can be a collector optical system comprising a collective mirror having a reflecting surface of an ellipsoid of revolution, and an auxiliary collective mirror consisting of a spherical surface with its spherical center at the first focal point of the collective mirror, which is arranged to satisfy R>(t×c)/2, where R is a radius of the auxiliary collective mirror, t a duration of pulsed light from the plasma light source, and c the speed of light.

The foregoing embodiment uses the light source of the LPP type as a plasma light source, but, without having to be limited to this, it is also possible to use a light source of the DPP type.

According to the present invention, as described above, the position of the spherical center of the auxiliary collective mirror is a little displaced from the position of the plasma light source, whereby the EUV light reflected by the auxiliary collective mirror is not absorbed by the plasma. This enables much more EUV light than before to be efficiently collected. When the light source unit with drastically increased efficiency of collection of light as described above is applied to the exposure apparatus, it becomes feasible to achieve a significant increase of throughput.

In the present invention, the round-trip distance between the plasma light source and the auxiliary collective mirror is set longer than the distance being the product of the duration of the pulsed light from the plasma light source and the speed of light, whereby the plasma becomes extinct before the EUV light from the plasma light source comes back after reflected by the auxiliary collective mirror. Therefore, the EUV light reflected by the auxiliary collective mirror is not absorbed by the plasma. This enables much more EUV light than before to be efficiently collected. When the light source unit with drastically increased efficiency of collection of light is applied to the exposure apparatus, it becomes feasible to achieve a significant increase of throughput.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A light source unit of EUV light comprising:
   a plasma light source for emitting EUV light;
   a collective mirror which has a reflecting surface of an ellipsoid of revolution and at a first focal point of which the plasma light source is located; and
   an auxiliary collective mirror which has a reflecting surface of a spherical surface and a center of the spherical surface of which is located as displaced from a position of the plasma light source.

2. The light source unit according to claim 1, wherein the center of the spherical surface of the auxiliary collective mirror is located in a plane passing the first focal point of the collective mirror and being perpendicular to the optical axis, and is displaced by a distance equal to or larger than a radius of the plasma light source from the optical axis.

3. The light source unit according to claim 2, wherein the auxiliary collective mirror is comprised of a plurality of mirror elements having respective positions of spherical centers different from each other.

4. The light source unit according to claim 3, wherein the auxiliary collective mirror is comprised of at least four mirror elements.

5. The light source unit according to claim 4, wherein the collective mirror is divided into a partial mirror located near and a partial mirror located away from the plasma light source, and wherein only the partial mirror located near the plasma light source is arranged so as to be replaceable.

6. An illumination optical apparatus comprising the light source unit as defined in claim 5, and an illumination optical system for guiding the EUV light from the light source unit to a mask.

7. An exposure apparatus comprising:
   an illumination optical apparatus for illuminating a reflective mask on which a predetermined pattern is formed;
   a mask stage for holding a mask on a surface to be illuminated by the illumination optical apparatus;
   a wafer stage for holding a wafer;
   a projection optical system for projecting the predetermined pattern formed on the mask, at a predetermined demagnification ratio onto the wafer; and
   a driving unit for relatively moving the mask stage and the wafer stage relative to the projection optical system at a speed according to the demagnification ratio in synchronism on the occasion of projecting the predetermined pattern formed on the mask, onto the wafer,
   wherein the illumination optical apparatus is the illumination optical apparatus as defined in claim 6.

8. The light source unit according to claim 1, wherein the auxiliary collective mirror is comprised of a plurality of mirror elements having respective positions of spherical centers different from each other.

9. The light source unit according to claim 1, wherein the collective mirror is divided into a partial mirror located near and a partial mirror located away from the plasma light source, and wherein only the partial mirror located near the plasma light source is arranged so as to be replaceable.

10. An illumination optical apparatus comprising the light source unit as defined in claim 1, and an illumination optical system for guiding the EUV light from the light source unit to a mask.

11. An illumination optical apparatus comprising the light source unit as defined in claim 8, and an illumination optical system for guiding the EUV light from the light source unit to a mask.

12. An exposure apparatus comprising:
    an illumination optical apparatus for illuminating a reflective mask on which a predetermined pattern is formed;
    a mask stage for holding a mask on a surface to be illuminated by the illumination optical apparatus;
    a wafer stage for holding a wafer;
    a projection optical system for projecting the predetermined pattern formed on the mask, at a predetermined demagnification ratio onto the wafer; and a driving unit for relatively moving the mask stage and the wafer stage relative to the projection optical system at a speed according to the demagnification ratio in synchronism on the occasion of projecting the predetermined pattern formed on the mask, onto the wafer, wherein the illumination optical apparatus is the illumination optical apparatus as defined in claim 11.

13. An exposure apparatus comprising:

an illumination optical apparatus for illuminating a reflective mask on which a predetermined pattern is formed;

a mask stage for holding a mask on a surface to be illuminated by the illumination optical apparatus;

a wafer stage for holding a wafer;

a projection optical system for projecting the predetermined pattern formed on the mask, at a predetermined demagnification ratio onto the wafer; and a driving unit for relatively moving the mask stage and the wafer stage relative to the projection optical system at a speed according to the demagnification ratio in synchronism on the occasion of projecting the predetermined pattern formed on the mask, onto the wafer, wherein the illumination optical apparatus is the illumination optical apparatus as defined in claim 10.

14. An illumination optical apparatus comprising the light source unit as defined in claim 2, and an illumination optical system for guiding the EUV light from the light source unit to a mask.

15. An exposure apparatus comprising:

an illumination optical apparatus for illuminating a reflective mask on which a predetermined pattern is formed;

a mask stage for holding a mask on a surface to be illuminated by the illumination optical apparatus;

a wafer stage for holding a wafer;

a projection optical system for projecting the predetermined pattern formed on the mask, at a predetermined demagnification ratio onto the wafer; and a driving unit for relatively moving the mask stage and the wafer stage relative to the projection optical system at a speed according to the demagnification ratio in synchronism on the occasion of projecting the predetermined pattern formed on the mask, onto the wafer, wherein the illumination optical apparatus is the illumination optical apparatus as defined in claim 14.

16. An illumination optical apparatus comprising the light source unit as defined in claim 3, and an illumination optical system for guiding the EUV light from the light source unit to a mask.

17. An exposure apparatus comprising:

an illumination optical apparatus for illuminating a reflective mask on which a predetermined pattern is formed;

a mask stage for holding a mask on a surface to be illuminated by the illumination optical apparatus;

a wafer stage for holding a wafer;

a projection optical system for projecting the predetermined pattern formed on the mask, at a predetermined demagnification ratio onto the wafer; and a driving unit for relatively moving the mask stage and the wafer stage relative to the projection optical system at a speed according to the demagnification ratio in synchronism on the occasion of projecting the predetermined pattern formed on the mask, onto the wafer, wherein the illumination optical apparatus is the illumination optical apparatus as defined in claim 16.

18. A collector optical system comprising a collective mirror having a reflecting surface of an ellipsoid of revolution, and an auxiliary collective mirror consisting of a spherical surface having a spherical center at a first focal point of the collective mirror; and arranged to collect pulsed light emitted from a plasma light source, the collector optical system satisfying $R > (t \times c)/2$, where R is a radius of the auxiliary collective mirror, t a duration of the pulsed light from the plasma light source, and c the speed of light.

19. The collector optical system according to claim 18, wherein the radius of the auxiliary collective mirror is set to not less than 30 cm.

20. A light source unit wherein the plasma light source for emitting EUV light is placed at the first focal point of the collective mirror as defined in claim 19.

21. The light source unit according to claim 20, wherein the collective mirror is divided into a partial mirror located near and a partial mirror located away from the plasma light source, and wherein only the partial mirror located near the plasma light source is arranged so as to be replaceable.

22. An illumination optical apparatus comprising the light source unit as defined in claim 21, and an illumination optical system for guiding the EUV light from the light source unit to a mask.

23. A light source unit wherein the plasma light source for emitting EUV light is placed at the first focal point of the collective mirror as defined in claim 22.

24. A light source unit wherein the plasma light source for emitting EUV light is placed at the first focal point of the collective mirror as defined in claim 18.

25. An illumination optical apparatus comprising the light source unit as defined in claim 18, and an illumination optical system for guiding the EUV light from the light source unit to a mask.

26. An illumination optical apparatus comprising the light source unit as defined in claim 24, and an illumination optical system for guiding the EUV light from the light source unit to a mask.

27. An exposure apparatus comprising:

an illumination optical apparatus for illuminating a reflective mask on which a predetermined pattern is formed;

a mask stage for holding a mask on a surface to be illuminated by the illumination optical apparatus;

a wafer stage for holding a wafer;

a projection optical system for projecting the predetermined pattern formed on the mask, at a predetermined demagnification ratio onto the wafer; and a driving unit for relatively moving the mask stage and the wafer stage relative to the projection optical system at a speed according to the demagnification ratio in synchronism on the occasion of projecting the predetermined pattern formed on the mask, onto the wafer, wherein the illumination optical apparatus is the illumination optical apparatus as defined in claim 26.

28. An exposure apparatus comprising:

an illumination optical apparatus for illuminating a reflective mask on which a predetermined pattern is formed;

a mask stage for holding a mask on a surface to be illuminated by the illumination optical apparatus;

a wafer stage for holding a wafer;

a projection optical system for projecting the predetermined pattern formed on the mask, at a predetermined demagnification ratio onto the wafer; and a driving unit for relatively moving the mask stage and the wafer stage relative to the projection optical system at a speed according to the demagnification ratio in synchronism on the occasion of projecting the predetermined pattern formed on the mask, onto the wafer, wherein the illumination optical apparatus is the illumination optical apparatus as defined in claim 25.

29. An illumination optical apparatus comprising the light source unit as defined in claim 19, and an illumination optical system for guiding the EUV light from the light source unit to a mask.

30. An exposure apparatus comprising:
an illumination optical apparatus for illuminating a reflective mask on which a predetermined pattern is formed;
a mask stage for holding a mask on a surface to be illuminated by the illumination optical apparatus;
a wafer stage for holding a wafer;
a projection optical system for projecting the predetermined pattern formed on the mask, at a predetermined demagnification ratio onto the wafer; and
a driving unit for relatively moving the mask stage and the wafer stage relative to the projection optical system at a speed according to the demagnification ratio in synchronism on the occasion of projecting the predetermined pattern formed on the mask, onto the wafer,
wherein the illumination optical apparatus is the illumination optical apparatus as defined in claim 29.

31. A method of manufacturing a micro device using an exposure apparatus according to claim 13, the method comprising the steps of:
illuminating the mask using the illumination optical system; and
projecting a pattern of the mask on a photosensitive substrate using the projection optical system.

32. A method of manufacturing a micro device using an exposure apparatus according to claim 28, the method comprising the steps of:
illuminating the mask using the illumination optical system; and
projecting a pattern of the mask on a photosensitive substrate using the projection optical system.

33. A light source unit comprising:
a plasma light source which emits EUV light;
a collective mirror which converges the light emitted from the plasma light source to a predetermined position; and
an auxiliary collective mirror which reflects the light emitted from the plasma light source to guide the reflected light near the plasma light source,
relative arrangement of the auxiliary collective mirror with respect to the corrective mirror being set to have a predetermined relationship therebetween so that the absorption of reflection light from the auxiliary corrective mirror which is caused by returning back to the plasma light source decreases,
wherein the auxiliary corrective mirror converges the EUV light at a position which is shifted from a position of the plasma light source.

34. The light source as defined in claim 33, wherein the plasma light source emits pulsed EUV light by plasma periodically generated, and the auxiliary corrective mirror converges the EUV light to the position of the plasma light source during plasma generation period which is periodically generated in the plasma light source.

35. The light source as defined in claim 33, wherein the auxiliary corrective mirror reflects light emitted from the plasma light source and directed to out of a reflection area of the corrective mirror.

36. An illumination optical apparatus comprising:
a light source unit as defined in claim 33; and
illumination optical system for guiding EUV light which is converged to a predetermined position by the light source unit to a mask.

37. An exposure apparatus comprising:
a light source unit as defined in claim 33;
illumination optical system for guiding EUV light which is converged to a predetermined position by the light source unit to a mask; and
projection optical system which projects a pattern of the mask on a photosensitive substrate.

38. A method of manufacturing a micro device using an exposure apparatus as defined in claim 37, the method comprising the steps of:
illuminating the mask using the illumination optical system; and
projecting a pattern of the mask on a photosensitive substrate using the projection optical system.

39. An illumination apparatus comprising:
a light source unit as defined in claim 34; and
illumination optical system for guiding EUV light which is converged to a predetermined position by the light source unit to a mask.

40. An exposure apparatus comprising:
a light source unit as defined in claim 34;
illumination optical system for guiding EUV light which is converged to a predetermined position by the light source unit to a mask; and
projection optical system which projects a pattern of the mask on a photosensitive substrate.

41. A method of manufacturing a micro device using an exposure apparatus as defined in claim 40, the method comprising the steps of:
illuminating the mask using the illumination optical system; and
projecting a pattern of the mask on a photosensitive substrate using the projection optical system.

42. An illumination apparatus comprising:
a light source unit as defined in claim 35; and
illumination optical system for guiding EUV light which is converged to a predetermined position by the light source unit to a mask.

43. An exposure apparatus comprising:
a light source unit as defined in claim 35;
illumination optical system for guiding EUV light which is converged to a predetermined position by the light source unit to a mask; and
projection optical system which projects a pattern of the mask on a photosensitive substrate.

44. A method of manufacturing a micro device using an exposure apparatus as defined in claim 35, the method comprising the steps of:
illuminating the mask using the illumination optical system; and
projecting a pattern of the mask on a photosensitive substrate using the projection optical system.

45. A method of providing EUV light, comprising the steps of:
emitting EUV light by using a plasma light source;
converging the light emitted from the plasma light source to a predetermined position by using a collective mirror;
reflecting the light emitted from the plasma light source by using an auxiliary collective mirror to guide the reflected light near the plasma light source; and
arranging relative arrangement of the auxiliary collective mirror with respect to the corrective mirror to be set to have a predetermined relationship therebetween so that the absorption of reflection light from the auxiliary corrective mirror which is caused by returning back to the plasma light source decreases, wherein the converging step comprises a step of converging the EUV light at a position which is shifted from a position of the plasma light source.

46. The method as defined in claim 45, wherein the emitting step comprises a step of emitting pulsed EUV light by plasma periodically generated, and the reflecting step comprises a step of converging the EUV light to the position of the plasma light source during plasma generation period which is periodically generated in the plasma light source.

47. The method as defined in claim 45, wherein the reflecting step comprises a step of reflecting light which is emitted from the plasma light source and which is directed to out of a reflection area of the corrective mirror.

48. The method as defined in claim 45, further comprising the steps of:
guiding EUV light converged at the predetermined position to an illumination optical system; and
guiding the EUV light passed thorough the illumination optical system to an object to be illuminated.

49. A method of manufacturing a micro device using the method as defined in claim 45, comprising the steps of:
guiding EUV light converged at the predetermined position to a mask; and
performing exposure of a pattern of the mask on a photosensitive substrate to a pattern of the mask.

50. An illumination method using the method as defined in claim 46, comprising the steps of:
guiding EUV light converged at the predetermined position to an illumination optical system; and
guiding the EUV light passed thorough the illumination optical system to an object to be illuminated.

51. A method of manufacturing a micro device using the method as defined in claim 46, comprising the steps of:
guiding EUV light converged at the predetermined position to a mask; and
performing exposure of a pattern of the mask on a photosensitive substrate to a pattern of the mask.

52. An illumination method using the method as defined in claim 47, comprising the steps of:
guiding EUV light converged at the predetermined position to an illumination optical system; and
guiding the EUV light passed thorough the illumination optical system to an object to be illuminated.

53. A method of manufacturing a micro device using the method as defined in claim 47, comprising the steps of:
guiding EUV light converged at the predetermined position to a mask; and
performing exposure of a pattern of the mask on a photosensitive substrate to a pattern of the mask.

* * * * *